United States Patent
Kihara et al.

(10) Patent No.: US 6,781,413 B2
(45) Date of Patent: Aug. 24, 2004

(54) LEVEL CONVERSION CIRCUIT FOR WHICH AN OPERATION AT POWER VOLTAGE RISE TIME IS STABILIZED

(75) Inventors: Fukuji Kihara, Kawasaki (JP); Yuki Kaneko, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/270,649

(22) Filed: Oct. 16, 2002

(65) Prior Publication Data

US 2003/0098712 A1 May 29, 2003

(30) Foreign Application Priority Data

Nov. 28, 2001 (JP) ........................................ 2001-362632

(51) Int. Cl.[7] .......................................... H03K 19/0175
(52) U.S. Cl. ............................. 326/68; 326/81; 326/83; 326/63; 327/333
(58) Field of Search ............................. 326/62, 63, 68, 326/81, 83; 327/51–57, 333

(56) References Cited

U.S. PATENT DOCUMENTS 6,204,696 B1 * 3/2001 Krishnamurthy et al. ..... 326/98
6,518,816 B2 * 2/2003 Riccio et al. ................ 327/333
6,535,019 B2 * 3/2003 De Santis ..................... 326/83

* cited by examiner

*Primary Examiner*—Vibol Tan
(74) *Attorney, Agent, or Firm*—Arent Fox, PLLC.

(57) ABSTRACT

A level conversion circuit for converting a first signal at a lower power source side into a second signal at a higher power source side, which is higher than the lower power source, includes first and second transistors provided at a ground side and controlled by the first signal and an inverted signal there of; third and fourth transistors gates and drains of which are cross-connected, provided at the higher power source side and connected to the first and second transistors respectively; and an initialization circuit for, at a higher power voltage rise time, reducing (or raising), along a current path, a level of either a first node located between the first and third transistors, or a second node located between the second and fourth transistors, to a ground voltage (or to a voltage of the higher power source).

13 Claims, 8 Drawing Sheets

LEVEL CONVERSION CIRCUIT FOR WHICH AN OPERATION AT POWER VOLTAGE RISE TIME IS STABILIZED

BACKGROUND OF THE INVENTION

1. Field of the Invention

The present invention relates to a level conversion circuit for converting a signal on a lower power voltage side to a signal on a higher power voltage side, and relates in particular to a level conversion circuit for which an operation at the power voltage rise time is stabilized.

2. Related Background Arts

A semiconductor integrated circuit employs multiple power voltages to reduce the consumption of power by an internal circuit. For example, an internal power voltage used for an internal circuit is generated from an externally supplied a higher power voltage, and the internal power voltage is supplied to the internal circuit to reduce the consumption of power by the internal circuit. Since an output signal generated by the internal circuit is a lower voltage internal signal, at the front stage of an output circuit, a level conversion circuit converts the level of this signal into a signal for the higher external power source. As another example semiconductor integrated circuit which uses multiple power voltages, when a lower power voltage first circuit outputs a signal to a higher power voltage second circuit, at the output stage of the first circuit, the level conversion circuit converts a lower voltage signal into a higher voltage signal.

FIG. 13 is a circuit diagram showing a conventional level conversion circuit. VccL denotes a lower power voltage and VccH denotes a higher power voltage, while a P denotes a P channel transistor and an N denotes an N channel transistor. The lower power voltage VccL is 3 V, for example, and the higher power voltage VccH is 5 V, for example.

In a level converter 10, the level conversion circuit converts a signal A on the lower power voltage side into a signal X on the higher power voltage side; the signal A and a signal /A (bar A; this same descriptive convention is employed hereinafter) for the inverted phase, which is generated by an inverter constituted by transistors P1 and N2, are respectively transmitted to the gates of transistors N6 and N4; the respective gates of transistors P3 and P5 are cross-connected to the drains of transistors P5 and P3, while the sources of both transistors are connected to the higher power voltage VccH; and a node /B is connected to an output buffer circuit, constituted by transistors P7 and N8, which is connected to the higher power voltage VccH.

During normal operation, when the signal A on the lower power voltage side is at level H (3 V), the inverted signal /A goes to level L (0 V), the transistor N6 is rendered conductive and the transistor N4 is rendered non-conductive, and the node /B is reduced to level L. As the level of the node /B is reduced, the transistor P3 is rendered conductive, the level of the node B is raised to the level of the higher power voltage VccH, and the transistor P5 is rendered non-conductive. As a result, the node /B is fully reduced to level 0 V, the transistor N8 of the output buffer circuit is rendered non-conductive, and the transistor P7 is rendered conductive, so that the output X goes to level H (5 V). That is, the signal A on the lower power voltage side (3 V) is converted into the signal B on the higher power voltage side (5 V). When the signal A is at level L, the transistor N4 is rendered conductive and the transistor N6 is rendered non-conductive, and since the inverted phase operation is performed, the output X goes to level L. Thus, since the node /B becomes the level of higher power voltage, the transistor P7 of the output buffer circuit is rendered fully off.

As is described above, in the level conversion circuit of the level converter 10, the node B of one of the transistors P3 and P5, the respective gates and drains of which are cross-connected, is employed to render on or off the transistor P5, and an H level voltage is generated at the other node /B.

FIG. 14 is a diagram showing the power voltage relationships for a semiconductor integrated circuit. Normally, a lower power voltage generator 12 uses the higher power voltage VccH to generate the lower power voltage VccL. Therefore, when the power is on and the higher power voltage VccH rises, accordingly, the lower power voltage VccL also rises. On the higher power voltage side in FIG. 13, the signal X, obtained by level conversion, is transmitted to output circuits 14 and 16, located between the circuit on the lower power voltage side and the circuit on the higher power voltage side, and outputs OUT1 and OUT2 are driven by the high driving capabilities of the output circuits 14 and 16. Therefore, the power voltages of the output circuits 14 and 16 are the higher power voltage VccH.

FIG. 15 is a graph for explaining the problem presented by the level conversion circuit in FIG. 13. When the externally applied higher power voltage VccH rises while the power is on, the nodes B and /B in the level conversion circuit may go to a level midway between the higher power voltage level and the ground level, and a penetration current may flow across the transistors P7 and N8 of the output buffer circuit. Accordingly, the signal X on the higher power voltage side becomes to a level midway between level H (VccH) and level L (0 V). At this level, the signal X generates a strong penetration current that passes through the output circuits 14 and 16 in FIG. 14.

Specifically, the lower power voltage VccL rises as the higher power voltage VccH rises, but this rise in the lower power voltage VccL is unsatisfactory by the penetration current generated by the initial unstabilized operation of the level conversion circuit. In this initial state, one of the signals A and /A on the lower voltage side can not rise to the level H, and neither of the transistors N4 and N6 can be rendered conductive. If the higher power voltage VccH rises under these conditions, both of the nodes B and /B rise and stay at a level lower than the high power voltage VccH by the threshold voltage Vth of the transistors P3 and P5 (see FIG. 15). Therefore, the nodes B and /B are maintained at the middle level, the penetration current flows across the transistors P7 and N8, and the signal X on the higher voltage side also goes to the middle level, which causes a strong penetration current to the output circuits 14 and 15 to which the signal X is supplied. As a result, the lower power voltage generator 12 can not raise the lower power voltage VccL and this state is continued, unchanged. In the worst case, after the power-on a normal operation of the device is not possible.

SUMMARY OF THE INVENTION

It is, therefore, one objective of the present invention to provide a level conversion circuit for which the operation at the power voltage rise time is stabilized.

To achieve this objective, according to one aspect of the invention, a level conversion circuit for converting a first signal at a lower power source side into a second signal at a higher power source side, which is higher than the lower power source, comprises:

first and second transistors, provided at a ground side and controlled by the first signal and an inverted signal there of;

third and fourth transistors gates and drains of which are cross-connected, provided at the higher power source side and connected to the first and second transistors respectively; and an initialization circuit for, at a higher power voltage rise time, reducing (or raising), along a current path, a level of either a first node located between the first and third transistors, or a second node located between the second and fourth transistors, to a ground voltage (or to a voltage of the higher power source).

According to a preferred embodiment of the invention, the initialization circuit includes an initialization transistor circuit which is located between one node of either the first or the second node and the ground, and which is rendered conductive during a period in which the voltage of the higher power source rises and the voltage of the lower power source does not rise.

Further, according to another preferred embodiment of the invention, the initialization circuit includes:

a first initialization transistor circuit, which is provided between a specific node of, either the first or the second node and the higher power source and which is rendered conductive during a period wherein the voltage of the higher power source rises and the voltage of the lower power source does not rise; and a second initialization transistor circuit, which is located between a remaining node of either the first or second node and the ground and which is rendered conductive in response to a rising of the level of the specific node.

According to an additional preferred embodiment of the invention, the initialization circuit includes:

a pull-up circuit, provided between a specific node of, either the first or the second node, and the higher power source, for raising the specific node to the level of the higher power source in response to the rising of the level of the higher power source; and a second initialization transistor, provided between the remaining node of, either the first or the second node and the ground, for being rendered conductive in response to the rising of the level of the specific node.

According to this preferred embodiment, it is preferable that the level conversion circuit include a first coupling capacitor provided between the higher power source and the specific node, or a second coupling capacitor provided between the ground and the remaining node. It is further preferable that both first and second coupling capacitors be provided.

According to the present invention provided is, an initialization circuit which, at the time a higher power voltage rises, reduces (or raises) the level of either the first or the second node to the ground potential (or to the higher power voltage). Therefore, even when the lower power voltage does not rise along the higher power voltage rises, either the level of the first or the second node is forcibly reduced to the ground potential (or raised to the higher power voltage), so it is prevented that the potential of the node approaches the middle so as to generate a penetration current.

DETAILED DESCRIPTION OF THE PREFERRED EMBODIMENTS

The preferred embodiments of the present invention will now be described while referring to the accompanying drawings. It should be noted, however, that the protective scope of the present invention is not limited to the following embodiments, and that it covers the invention defined by the claims and their equivalents.

Figure 1:
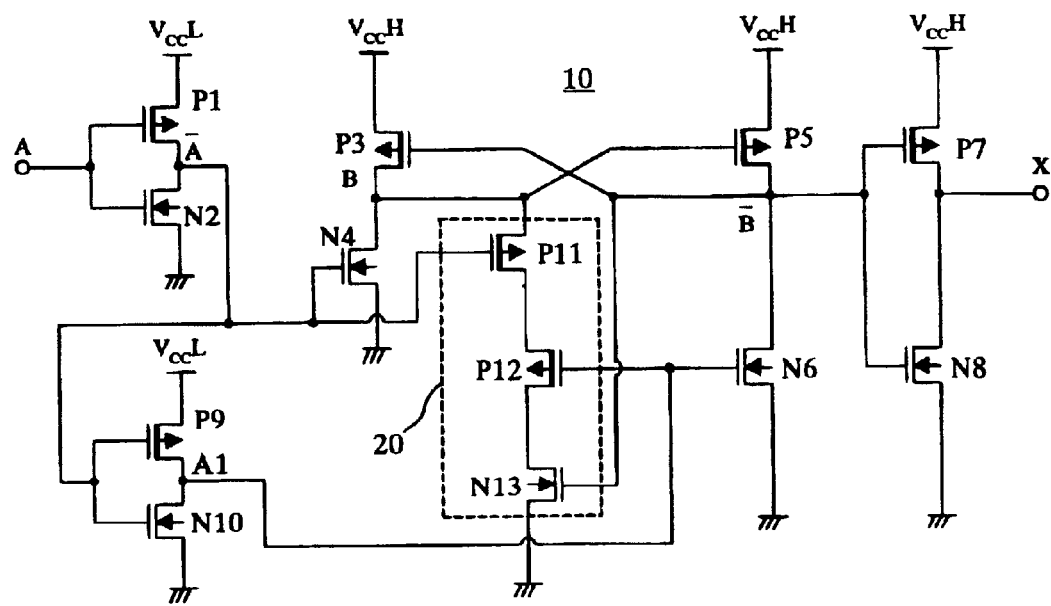
FIG. 1 is a circuit diagram showing a level conversion circuit according to a first embodiment of the present invention.

FIG. 1 is a circuit diagram showing a level conversion circuit according to a first embodiment of the present invention. In addition to the level conversion circuit shown in FIG. 13, an initialization circuit 20, constituted by transistors P11, P12 and N13, is arranged between a node /B and the ground terminal. The transistor P11 of the initialization circuit 20 is controlled by a node /A, the transistor P12 is controlled by the node A1, which is the inverted phase of the node /A, and the transistor N13 is controlled by a node /B. An inverter constituted by transistors P9 and N10 is added in order to generate the node /A and the inverted signal A1; however, an input signal A may be directly applied to the gate of the transistor P12. Further, only one of the transistors P11 and P12 may be provided.

For the level conversion circuit, assume a case in which, the input signal A is at level L, and a lower power voltage VccL rises after a delay, or does not rise for a specific reason when a higher power voltage VccH rises. In this case, as the lower power voltage VccL does not rise, the potential of the node /A is maintained at level L even though the input signal A is at level L. Also, the potential of the node A1 is also maintained at level L.

Figure 13:
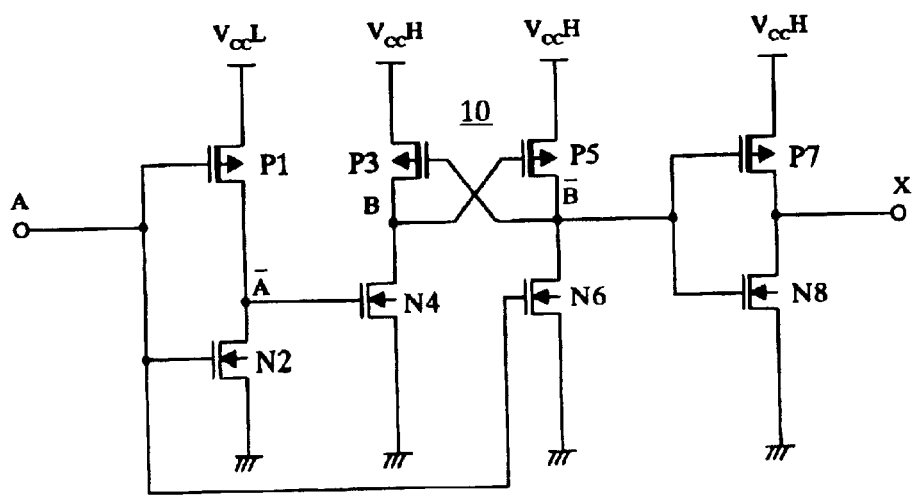
FIG. 13 is a circuit diagram showing a conventional level conversion circuit.
Figure 14:
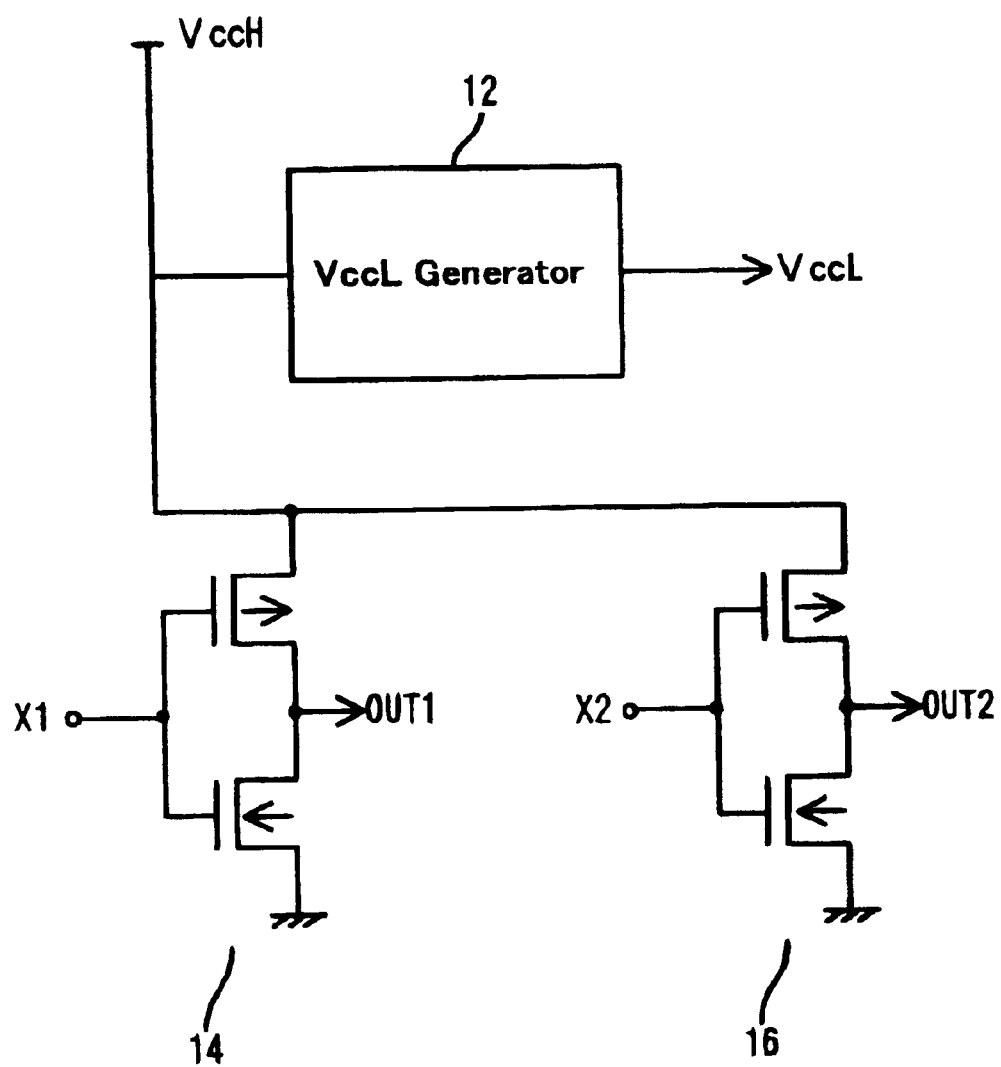
FIG. 14 is a diagram showing the power source relationships for a semiconductor integrated circuit.

Referring to FIG. 13, in this state, the transistors N4 and N6 are rendered non-conductive and the nodes B and /B go to the middle potential. In the level conversion circuit in FIG. 1, both the transistors P11 and P12 of the initialization circuit 20 are rendered conductive because the node /A and the inverted signal A1 are at level L. Further, along the higher power voltage VccH rises in this state, both of the nodes B and /B are activated at a potential lower than the high power voltage VccH by the threshold voltage Vth of the transistors P3 and P5. Then, in response to the rising of the node /B, the transistor N13 of the initialization circuit 20 is rendered conductive, and via the current path, the potential of the node B can be reduced to the ground potential.

That is, while the lower power voltage VccL does not rise, the transistors P11 and P12 are conductive, and the transistor N13 becomes conductive in response to the rising of the higher power source VccH so that the initialization circuit 20 are rendered conductive, and accordingly it is ensured that the level of the node B is reduced to the ground potential. When the node B falls to the ground potential, the transistor P5 is rendered conductive through the normal level conversion operation, and the level of the node /B is raised to the level of the higher power voltage VccH. Accordingly, the transistor P3 is rendered completely non-conductive. As is described above, since the nodes B and /B are prevented from being unstabilized at the middle potential, the penetration current across the output buffer circuits P7 and N8 does not occur, and the output signal X is determined to be level L.

When the lower power voltage VccL finally rises since the penetration current does not occur, the node /A goes to level H (VccL level), the transistor P11 of the initialization circuit 20 is rendered non-conductive, and the initialization circuit 20 is inactivated. Thereafter, the original operation of the level conversion circuit is performed in accordance with the change in the input signal A.

Even when the input signal A is at level H, the same operation is performed at the initialization circuit 20. It should be noted, however, that after the lower power voltage VccL rises, the transistor P12 of the initialization circuit 20 is rendered non-conductive, and the initialization circuit 20 becomes inactive.

As is described above, since the nodes /A and A1 having inverted phase are supplied to the transistors P11 and P12 of the initialization circuit 20, in the normal operation state one of these transistors is always rendered non-conductive and the initialization circuit 20 becomes inactive. Then, in the state which is the subject of this embodiment, i.e., in the state wherein the lower power voltage VccL does not rise, both of the transistors P11 and P12 are rendered conductive, and the initialization circuit 20 becomes active. Therefore, in accordance with the rise of the higher power voltage VccH, the transistor N13 can be rendered conductive, and the node B can be dropped to the ground potential.

Figure 2:
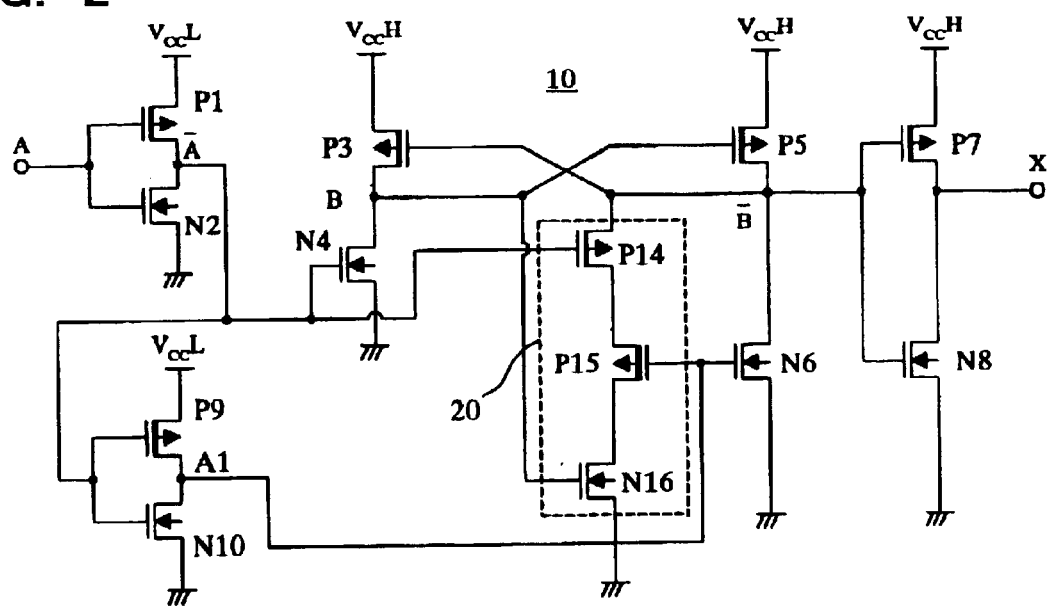
FIG. 2 is a circuit diagram showing another level conversion circuit according to the first embodiment of the present invention.

FIG. 2 is a circuit diagram showing another level conversion circuit according to the first embodiment. In this example, the initialization circuit 20 is arranged between the node /B on the opposite side and the ground. Further, as in FIG. 1, the transistors P14 and P15 of the initialization circuit 20 are controlled by the nodes /A and A1, and the transistor N16 is controlled by the node B inverted from the node in FIG. 1. Therefore, the operation is the same as that in FIG. 1.

That is, when, at the time the higher power voltage VccH rises, the lower power voltage VccL rises after a delay or does not rise for a specific reason, the transistors P14 and P15 are rendered conductive, and when the node B rises to the middle potential, in response to a rise in the higher power voltage VccH, the transistor N16 is rendered conductive. As a result, the node /B is forcibly dropped from the middle potential to the ground potential, and the other node B is raised to the level of the higher power voltage VccH via the transistor P3.

Figure 3:
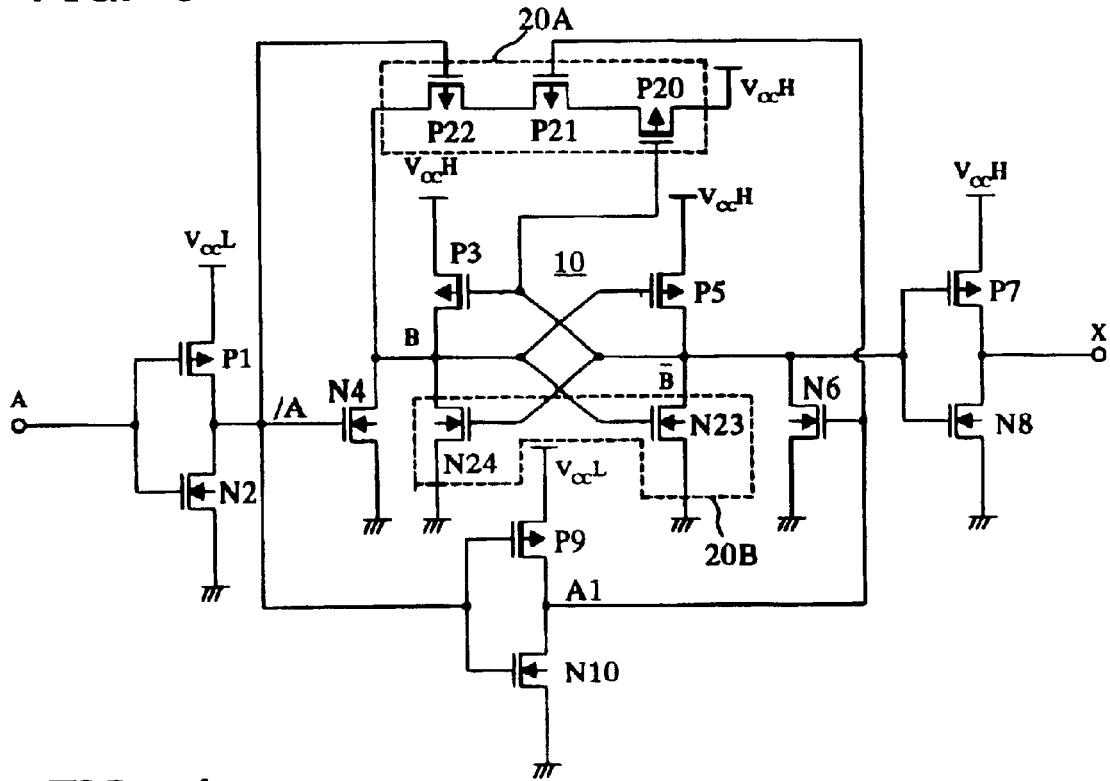
FIG. 3 is a circuit diagram showing a level conversion circuit according to a second embodiment of the present invention.

FIG. 3 is a circuit diagram showing a level conversion circuit according to a second embodiment of the present invention. In this embodiment, an initialization circuit 20A, which includes transistors P20, P21 and P22, is located between a node B of a level converter 10 and a higher power source VccH, and when a lower power voltage VccL does not rise at the time the higher power voltage VccH rises, the node B is forcibly raised equal to the voltage on the higher power side. When the lower power voltage VccL does not rise, both the nodes /A and A1 are at level L, and accordingly, the transistors P21 and P22 are rendered conductive. In this state, when the higher power voltage VccH rises, the transistor P20 is also rendered conductive, and the initialization circuit 20A becomes conductive.

However, the conductive state of the transistor P20 is the same as that of the transistor P3 in the level conversion circuit 10. That is, the gate potential of the transistor P20 does not reach to the ground level, and thus, the transistor P20 can not completely raise the node B to the level of the higher power voltage VccH. It should be noted, however, that the node B is pulled up to the level of the higher power voltage VccH by a higher-level driving capability than the other node /B. In other words, the level of the node B is raised equal to the higher power voltage VccH by the two transistors P3 and P20, while the level of the node /B is raised equal to the high power voltage VccH only by the transistor P5.

In this embodiment, a second initialization circuit 20B is provided. The initialization circuit 20B includes transistors N23 and N24, which are located between the nodes B and /B and the ground. For the transistors N23 and N24, the gates and the drains are cross-connected respectively. In the second initialization circuit 20B, in response to the node B raised to the high power voltage VccH by the first initialization circuit 20A, the transistor N23 is rendered conductive first, and the node /B is dropped to the ground potential. Even though the transistor N24 becomes conductive in response to the rise of the node /B relative to the conflict with the transistor N23, the transistor N24 can not be rendered fully conductive, and is rendered non-conductive by pulling down the level of the node /B.

Therefore, it is ensured that the node /B will be pulled down to the ground potential, and that accordingly, the node B will be raised to the higher power voltage VccH via the transistor P3. As a result, it is possible to prevent the nodes B and /B from approaching the middle potential and to prevent the occurrence of a penetrating current, and to permit the lower potential voltage VccL to rise following the rise of the higher power voltage VccH.

Since in normal operation the transistors N23 and N24 in the second initialization circuit 20B are operated in the same manner as the respective transistors N6 and N4, normal operation is not adversely affected by them. In the example in FIG. 3, the second initialization circuit 20B may include only the transistor N23.

Figure 4:
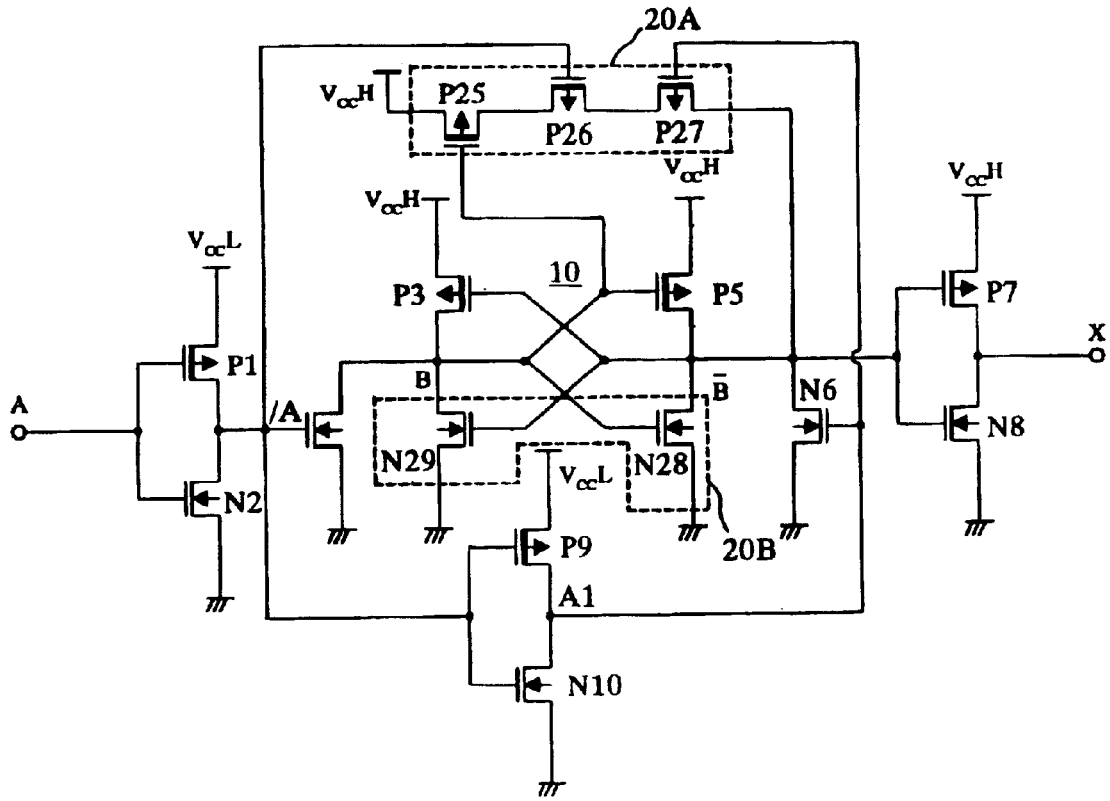
FIG. 4 is a circuit diagram showing another level conversion circuit according to the second embodiment of the present invention.

FIG. 4 is a circuit diagram showing another level conversion circuit according to the second embodiment. In this circuit, a first initialization circuit 20A is located between a node /B, on the side opposite to that in FIG. 3, and a higher power voltage VccH. Further, as in FIG. 3, a second initialization circuit 20B is located between the nodes B and /B and the ground. Also, again as in FIG. 3, the first initialization circuit 20A includes transistors P25, P26 and P27, and the second initialization circuit 20B includes transistors N28 and N29.

The operation performed by the circuit in FIG. 4 is the same as that shown in FIG. 3, with the exception that the node /B is raised to the higher power voltage VccH. That is, when a lower power voltage VccL does not rise while the higher power voltage VccH rises, the first initialization circuit 20A pulls the node /B up more strongly than the node B to the higher power voltage VccH. Therefore, in the operation of the second initialization circuit 20B for the conflict with the transistors N28 and N29, the transistor N29 is rendered more conductive, and the node B is more quickly pulled down to the ground potential. Accordingly, the node /B is raised completely to the higher power voltage VccH via the transistor P5.

Figure 5:
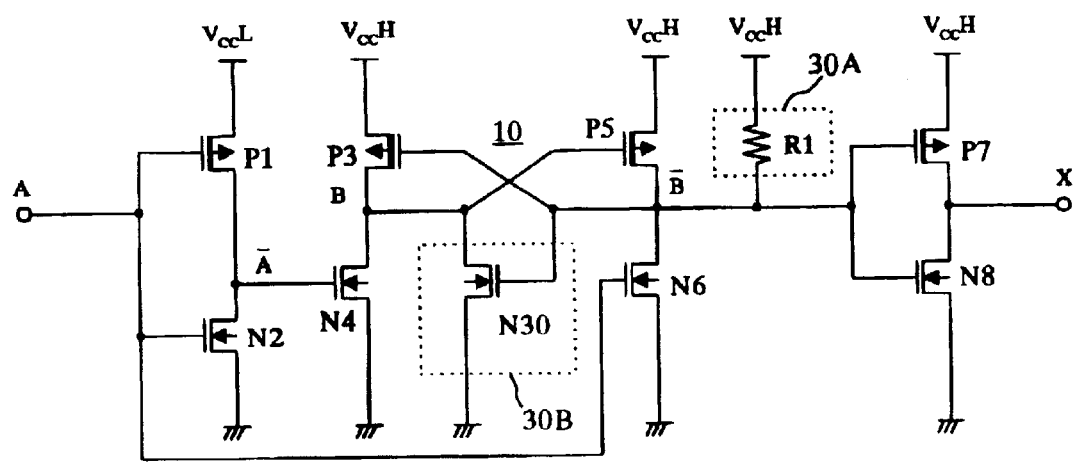
FIG. 5 is a circuit diagram showing a level conversion circuit according to a third embodiment of the present invention.

FIG. 5 is a circuit diagram showing a level conversion circuit according to a third embodiment of the present invention. In this example, the level conversion circuit comprises: a first initialization circuit 30A, for, when a lower power voltage VccL does not rise when a higher power voltage VccH rises, reducing the level of a node /B of a level converter 10 to the higher power voltage VccH; and a second initialization circuit 30B for, in response to this level rising, pulling down the other node B to the ground level.

The first initialization circuit 30A includes a pull-up resistor R1 located between the node /B and the higher power source VccH, and the second initialization circuit 30B includes a transistor N30 located between the node B and the ground. The gate of the transistor N30 is connected to the node /B.

When the lower power voltage VccL does not rise when the higher power voltage VccH rises, the two nodes B and /B are raised to the higher power voltage VccH via transistors P3 and P4. In this case, the node /B is raised to the higher level through the resistor R1. In response to this, the node /B reaches a level exceeding the threshold voltage Vth of the transistor N30 before the node B, and the transistor N30 is rendered conductive. Accordingly, the level of the node B is pulled down to the ground level, a transistor P5 is rendered conductive, and the level of the node /B is pulled up completely to the higher power voltage VccH. As a result, the nodes B and /B can be prevented from staying at the middle potential.

In the circuit in FIG. 5, the resistance of the resistor R1 is set comparatively high, so that in normal operation a penetrating current, which flows across the higher power source VccH, the resistor R1 and the transistor N6, is suppressed while the input signal A is at level H and the transistor N6 is rendered conductive. It should be noted, however, that the resistance of the resistor R1 is set so that the existence of the resistor R1 makes the pulled-up voltage level different between the node /B and the node B.

In FIG. 5, the pull-up resistor R1 may be provided on the node B side and the transistor N30 may be located between the node /B and the ground. In this case, the gate of the transistor N30 is connected to the node B, while the operation is performed in the same manner.

Figure 6:
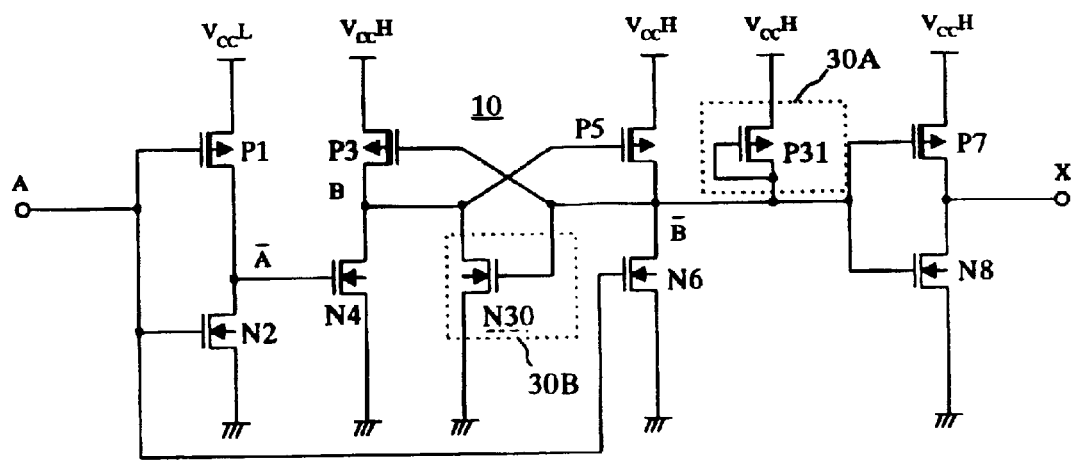
FIG. 6 is a circuit diagram showing another level conversion circuit according to the third embodiment of the present invention.

FIG. 6 is a circuit diagram showing another level conversion circuit according to the third embodiment. In this example, a pull-up transistor P31 is provided instead of the resistor R1 in FIG. 5. For the transistor P31, the gate and the drain are connected, and when the lower power voltage VccL does not rise when the higher power voltage VccH rises, the level of the node /B is raised to a level lower than the higher power voltage VccH by the threshold voltage Vth of P31. Therefore, the level of the node /B is raised more quickly than the node B by using the transistors P31 and P5 to increase the level to the higher power voltage VccH. Accordingly, the transistor N30 is rendered conductive, so that the node B is dropped to the ground potential, and the transistor P5 is rendered completely conductive. As a result, the level of the node /B is raised to the level of the higher power voltage VccH.

Also in this example, the pull-up transistor P31 may be provided on the node B side, and the transistor N30 may be provided between the node /B and the ground. In this case, the gate of the transistor N30 is connected to the node B. In this case, the same operation as above is performed.

In the third embodiment shown in FIGS. 5 and 6, at the rising time for the higher power voltage VccH, the level of the node /B is forcibly increased to the level of the higher power voltage VccH in a time-transient manner. When the input signal A reaches to level H, after the lower power voltage VccL rises thereafter, the transistor N6 is rendered conductive and the node /B is controlled at the ground potential, while the node B is controlled at the higher power voltage. The same thing can be applied for the first and the second embodiments.

Figure 7:
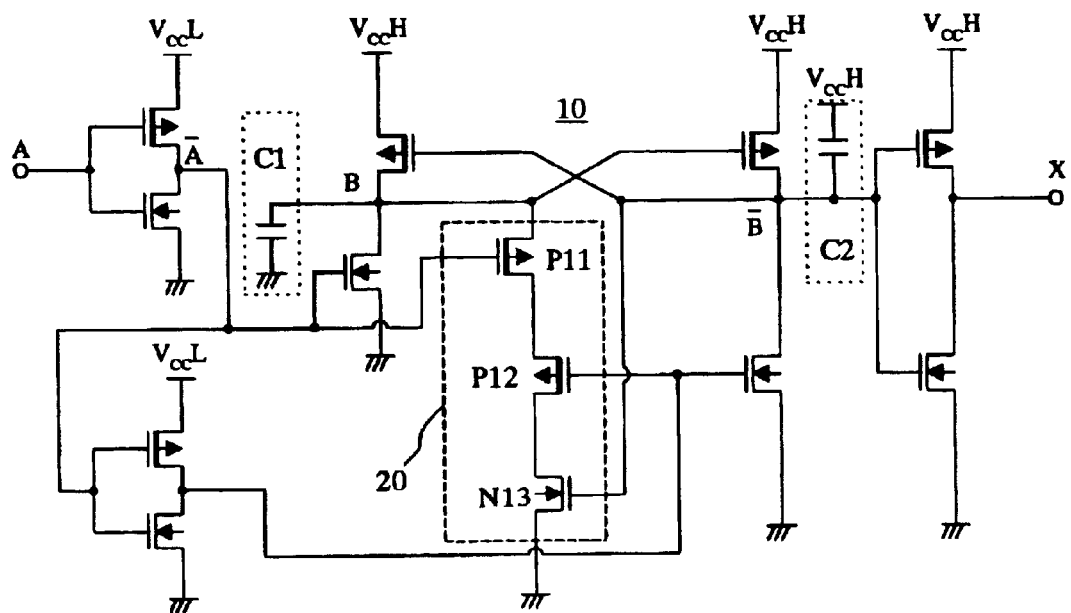
FIG. 7 is a circuit diagram showing a modification according to the first embodiment of the present invention.
Figure 8:
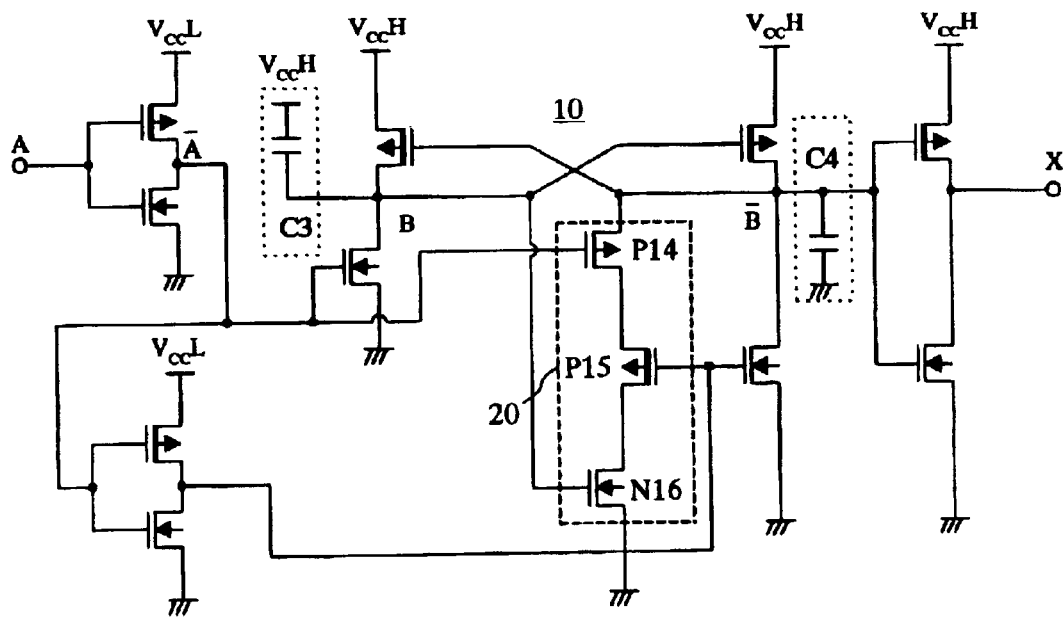
FIG. 8 is a circuit diagram showing another modification according to the first embodiment of the present invention.

FIGS. 7 and 8 are circuit diagrams showing a modification according to the first embodiment. For a level conversion circuit in FIG. 7, capacitors C1 and C2 are added to the configuration in FIG. 1. These capacitors, which serve as coupling capacitors when the higher power voltage VccH rises sharply, reduce the node B to the ground in an AC manner, and raise the node /B to the higher power voltage VccH in the AC manner. As a result, a potential difference can be generated between the nodes B and /B in a transient manner. Accordingly, in the addition to the operation of the initialization circuit 20, the node B can be quickly fixed at the ground level and the node /B can be fixed at the level of the higher power voltage VccH.

In FIG. 8, since the initialization circuit 20 is located on the node /B side, coupling capacitors C3 and C4 are also arranged on the side opposite to that in FIG. 7. With the coupling operation, the node B is set to a higher potential when the high power voltage VccH rises sharply, and in addition to the operation of the initialization circuit 20, the node B can be quickly fixed at the level of the higher power voltage VccH, and the node /B can be quickly fixed at the ground potential.

Figure 9:
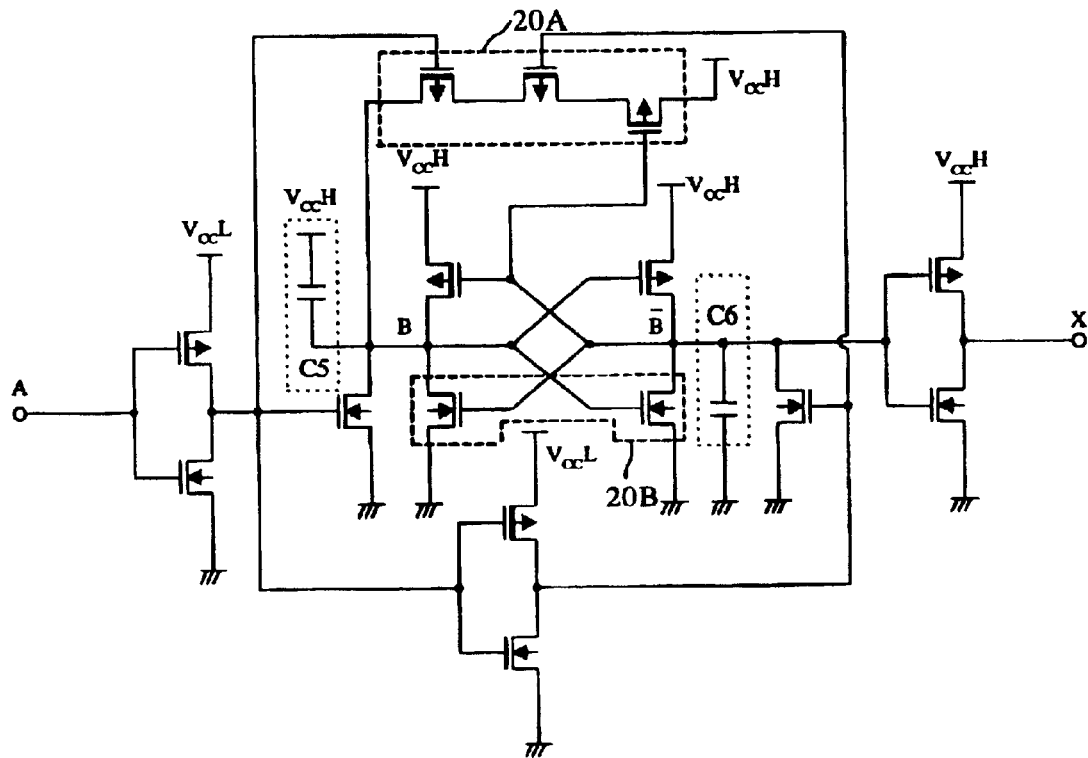
FIG. 9 is a circuit diagram showing a modification according to the second embodiment of the present invention.
Figure 10:
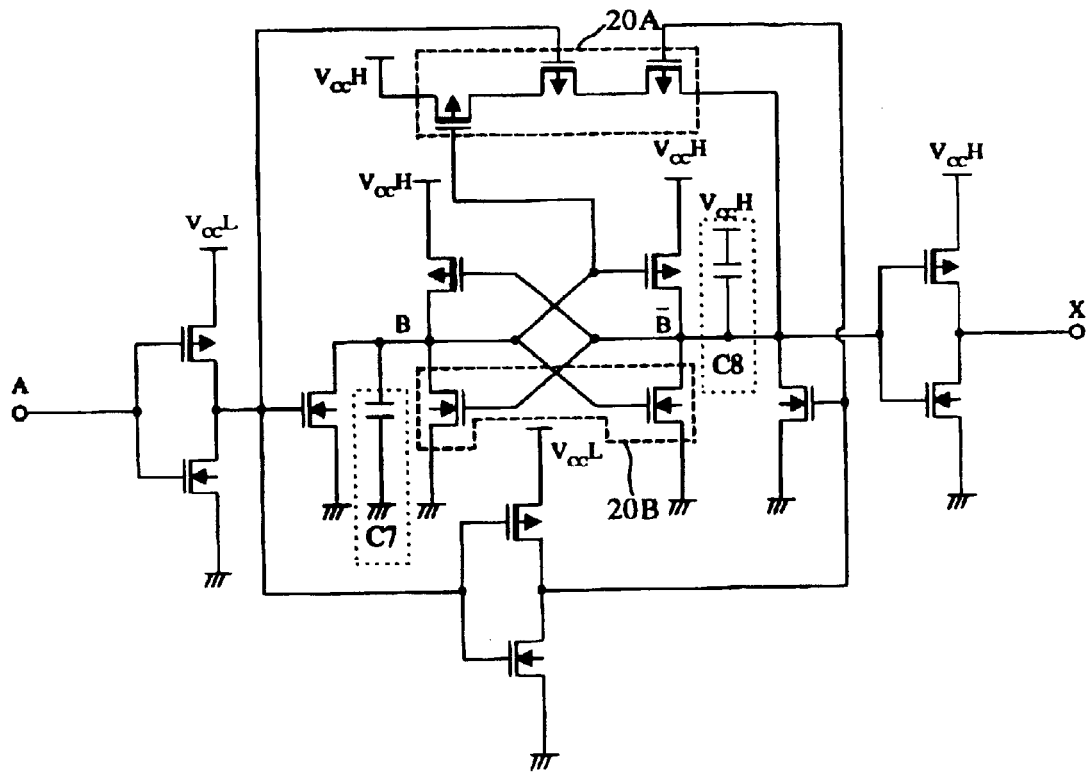
FIG. 10 is a circuit diagram showing another modification according to the second embodiment of the present invention.

FIGS. 9 and 10 are circuit diagrams showing modifications for the second embodiment. In these modifications, as in FIGS. 7 and 8, coupling capacitors C5 and C6, and C7 and C8 are added to the circuits in FIGS. 3 and 4. Through the operation of these coupling capacitors, in FIG. 9, the level of the node B is raised to the higher power voltage VccH in a transient manner, while the level of the node /B is pulled down to the ground. Accordingly, the nodes B and /B are quickly fixed to the respective levels H and L. In FIG. 10, the nodes B and /B are quickly fixed to potentials opposite those described above.

Figure 11:
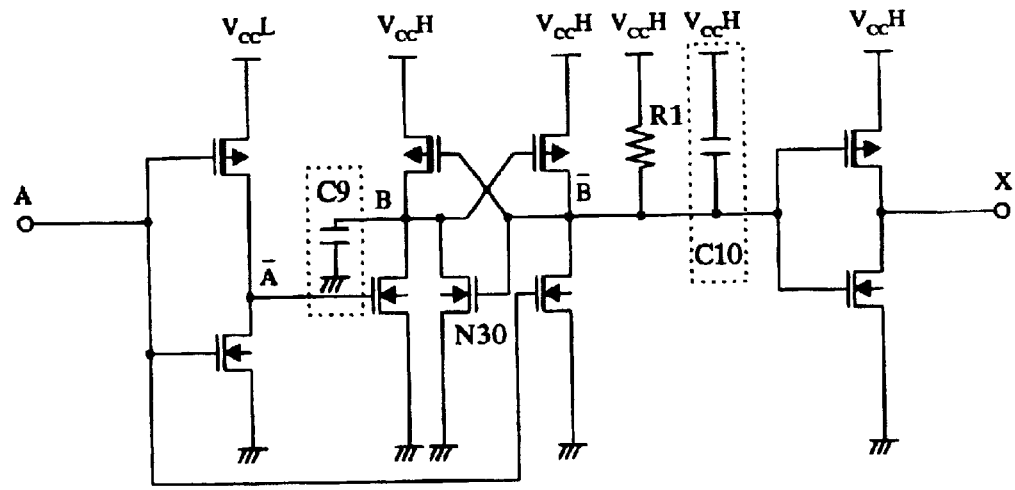
FIG. 11 is a circuit diagram showing a modification according to the third embodiment of the present invention.
Figure 12:
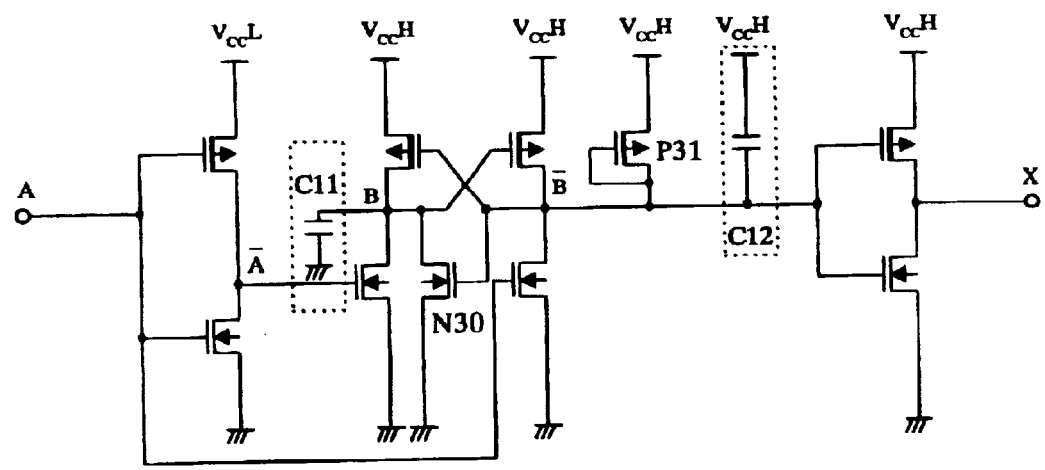
FIG. 12 is a circuit diagram showing another modification according to the third embodiment of the present invention.

FIGS. 11 and 12 are circuit diagrams showing modifications for the third embodiment. In these modifications, as in FIGS. 7 to 10, coupling capacitors C9 and C10, and C11 and C12 are added to the circuits in FIGS. 5 and 6. Through the operation of the coupling capacitors, the node B is pulled down to the ground in a transient manner, while the node /B is pulled up to the higher power voltage VccH. Accordingly, both nodes are quickly fixed at the corresponding potentials.

The coupling capacitors added in FIGS. 7 to 12 can not, by themselves, thoroughly prevent the unstable operation of the level conversion circuit at the source voltage rising. For this reason, even when, in a transient manner, a potential difference between the nodes B and /B is generated via an AC path of the coupling capacitors, the nodes B and /B are maintained at the middle potential so long as the lower power voltage VccL does not rise. Therefore, initialization circuits having DC paths must also be provided for these embodiments.

Figure 15:
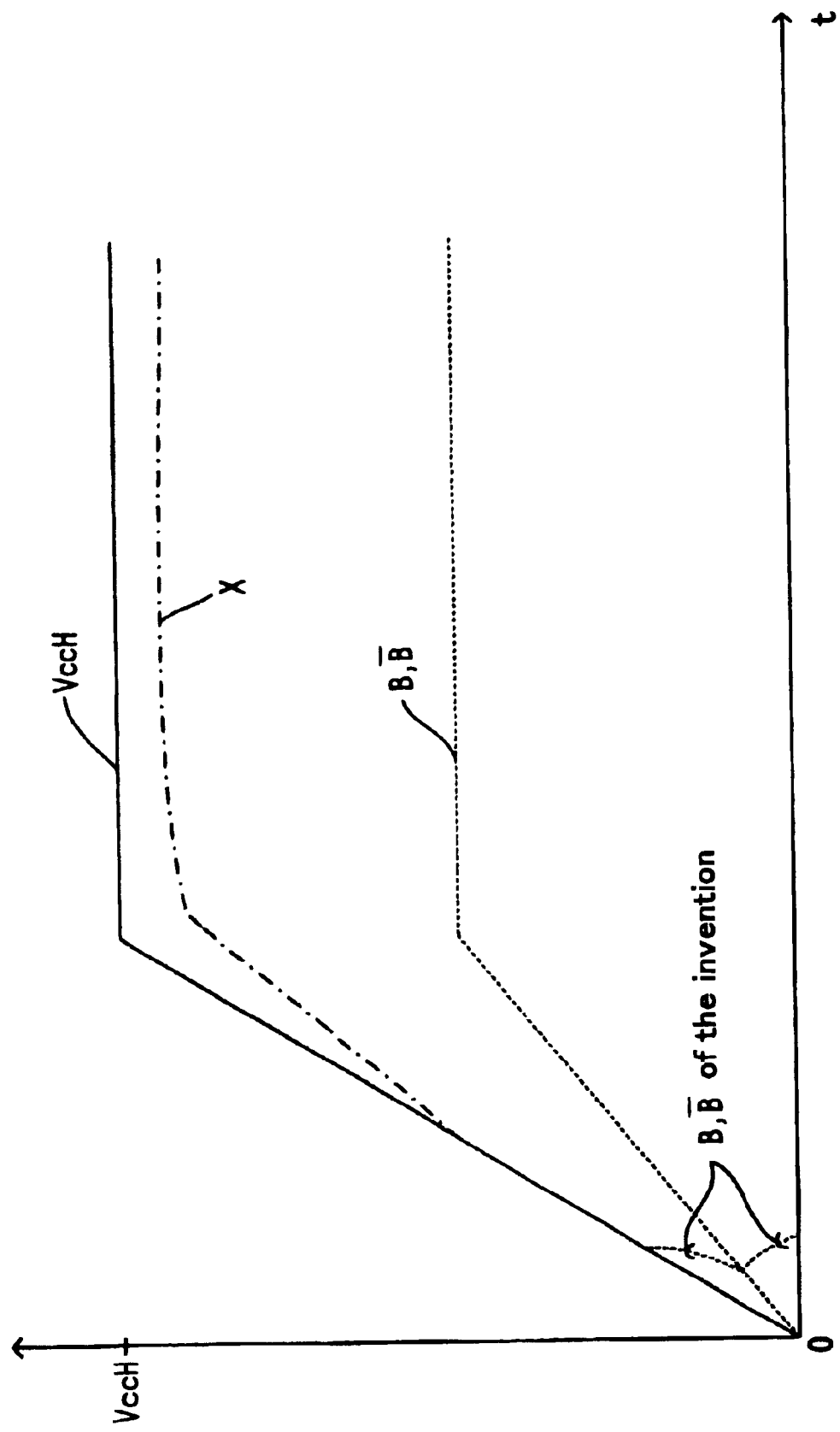
FIG. 15 is a graph for explaining a problem with the level conversion circuit in FIG. 13.

Since the initialization circuits in this embodiments are provided, the nodes B and /B can be quickly fixed to the respective levels H and L when the higher power voltage VccH rises. In FIG. 15, the level changes for the nodes B and /B are shown. In the graph in FIG. 15, waveforms describing B and /B of the invention represent the level changes of the nodes B and /B. Since, at the initial stage whereat the higher power voltage VccH rises, the potentials of these nodes are fixed at level H and level L, the occurrence of a conventional phenomenon is prevented in which the nodes B and /B stay at the middle level and the penetrating current flows, so as to render the rising of the lower power voltage VccL more difficult.

As is described above, according to the present invention, at a source voltage rising, such as when the power is switched on, it is possible to prevent the nodes of the level conversion circuits from staying at the middle potential, and to prevent the occurrence of a penetrating current in a buffer circuit and in an output circuit located at the following stages. Therefore, the occurrence of the worst possible phenomenon, whereof a device can not be activated because the lower power voltage does not rise, can be prevented.

What is claimed is:

1. A level conversion circuit for converting a first signal at a lower power source side into a second signal at a higher power source side, which is higher than the lower power source, comprising:

first and second transistors, provided to a ground side and controlled by said first signal and an inverted signal thereof;

third and fourth transistors gates and drains of which are cross-connected, provided to said higher power source side and connected to said first and second transistors respectively; and an initialization circuit for, at a higher power voltage rise time, reducing or raising, along a current path, a level of one node of either a first node located between said first and third transistors, or a second node located between said second and fourth transistors, to a ground voltage or to a voltage of said higher power source, wherein said initialization circuit includes an initialization transistor circuit which is located between one node of either said first or second node and the ground, and which is rendered conductive during a period in which the voltage of said higher power source rises and the voltage of said lower power source does not rise.

2. The level conversion circuit according to claim 1, wherein said initialization transistor is constituted by connecting in series a fifth transistor to be controlled by either of a signal having the same phase as said first signal or a signal having an inverted phase, and sixth transistor to be controlled by a remaining node of either said first or second node.

3. The level conversion circuit according to claim 1, wherein said initialization transistor is constituted by connecting in series a fifth transistor to be controlled by a signal having the inverted phase of said first signal, a sixth transistor to be controlled by a signal having the same phase as said first signal, and a seventh transistor to be controlled by a remaining node of either said first or said second node.

4. A level conversion circuit for converting a first signal at a lower power source side into a second signal at a higher power source side, which is higher than the lower power source, comprising:

first and second transistors, provided to a ground side and controlled by said first signal and an inverted signal thereof;

third and fourth transistors gates and drains of which are cross-connected, provided to said higher power source side and connected to said first and second transistor respectively; and an initialization circuit, wherein said initialization circuit includes:

a first initialization transistor circuit, which is provided between one node of either a first node located between said first and third transistors, or a second node located between said second and fourth transistors, and said higher power source and which is rendered conductive during a period in which the voltage of said higher power source rises and the voltage of said lower power source does not rise; and a second initialization transistor circuit, which is located between a remaining node of either the first or second node and said ground and which is rendered conductive in response to a rising of the level of said one node.

5. A level conversion circuit according to claim 4, wherein said first initialization transistor circuit is constituted by connecting in series in a fifth transistor to be controlled by a signal having the same phase as said first signal or a signal having said inverted phase, and a sixth transistor to be controlled by said remaining node.

6. The level conversion circuit according to claim 4, wherein said first initialization transistor circuit is constituted by connecting in series a fifth transistor to be controlled by a signal having the inverted phase of said first signal, a sixth transistor to be controlled by a signal having the same phase as said first signal, and a seventh transistor to be controlled by said remaining node.

7. The level conversion circuit according to claim 4, wherein said second initialization transistor circuit includes eighth and ninth transistors, provided between said first node and the ground and between said second node and said ground respectively, the gates and the drains of which are cross-connected respectively.

8. A level conversion circuit for converting a first signal at a lower power source side into a second signal at a higher power source side, which is higher than the lower power source, comprising:

first and second transistors, provided to a around side and controlled by said first signal and an inverted signal thereof;

third and fourth transistors gates and drains of which are cross-connected, provided to said higher power source side and connected to said first and second transistors respectively; and an initialization circuit, wherein said initialization circuit includes:

a pull-up circuit, provided between one node of either a first node located between said first and third transistors, or a second node located between said second and fourth transistors, and said higher power source, for raising said one node to the level of said higher power source, for raising said one node to the level of said higher power source in response to the rising of the level of said higher power source; and an initialization transistor, provided between the remaining node of either said first or said second node and the ground, for being rendered conductive in response to the rising of the level of said one node.

9. The level conversion circuit according to claim 8, wherein said pull-up circuit includes a pull-up resistor or a pull-up transistor having a drain and a gate being connected to each other, 10. The level conversion circuit according to claim 8, wherein said initialization transistor circuit includes a tenth transistor, the drain and the source of which are connected to said remaining node and said ground respectively, and a gate of which is controlled by said one node.

11. The level conversion circuit according to claim 1, further comprising:

a first coupling capacitor provided between said higher power source and said one node.

12. The level conversion circuit according to claim 1, further comprising:

a second coupling capacitor provided between said ground and a remaining node of either said first or second node.

13. A level conversion circuit, for converting a first signal at a lower power source side into a second signal at a higher power source side, which is higher than the lower power source, comprising:

first and second transistors, provided to a ground side and controlled by said first signal and an inverted signal thereof;

third and fourth transistors gates and drains of which are cross-connected, provided to said higher power source side and respectively connected to said first and second transistors; and an initialization circuit, provided between either a first node located between one node of either of said first and third transistors or a second node located between said second and fourth transistors, and a ground voltage or a voltage of said higher power source, for being rendered conductive during a period in which the voltage of said higher power source rises and the voltage of said lower power source does not rise.

* * * * *